(12) United States Patent
Kang et al.

(10) Patent No.: US 7,280,429 B2
(45) Date of Patent: *Oct. 9, 2007

(54) DATA LATCH CIRCUIT OF SEMICONDUCTOR DEVICE AND METHOD FOR LATCHING DATA SIGNAL

(75) Inventors: Hee-Bok Kang, Ichon-shi (KR); Jin-Hong Ahn, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/319,614

(22) Filed: Dec. 29, 2005

(65) Prior Publication Data
US 2006/0221723 A1    Oct. 5, 2006

(30) Foreign Application Priority Data
Mar. 31, 2005    (KR) ............. 10-2005-0027385

(51) Int. Cl.
*G11C 8/00* (2006.01)
(52) U.S. Cl. .................. 365/233; 365/189.05; 365/205
(58) Field of Classification Search .............. 365/233, 365/189.05, 205
See application file for complete search history.

(56) References Cited

U.S. PATENT DOCUMENTS 5,015,891 A  *  5/1991  Choi .................. 365/206
5,757,718 A     5/1998  Suzuki
RE35,847 E      7/1998  Lee
6,154,417 A    11/2000  Kim
6,498,766 B2   12/2002  Lee et al.

FOREIGN PATENT DOCUMENTS

JP    3-130991 A    6/1991
JP    10-208483 A    8/1998

* cited by examiner

*Primary Examiner*—Huan Hoang
(74) *Attorney, Agent, or Firm*—McDermott Will & Emery LLP

(57) ABSTRACT

A data latch circuit for latching a data and a method for latching a data signal in synchronization with a clock signal are provided. The data latch circuit includes: a data input controller for outputting a first data transition detection signal in response to a first transition point of the data signal, and outputting a second data transition detection signal in response to a second transition point of the data signal; and a data latch unit for starting latching the data signal in response to the first data transition detection signal and finishing latching the data signal in response to the second data transition detection signal, wherein the data latch unit deactivates the first data transition detection signal corresponding to the start of latching the data signal, and outputs a feedback signal for deactivating the second data transition detection signal corresponding to the finish of latching the data signal.

16 Claims, 5 Drawing Sheets

DATA LATCH CIRCUIT OF SEMICONDUCTOR DEVICE AND METHOD FOR LATCHING DATA SIGNAL

FIELD OF THE INVENTION

The present invention relates to a semiconductor integration circuit; and more particularly, to a data latch circuit for latching a data and a method for latching a data signal in synchronization with a clock signal.

DESCRIPTION OF RELATED ART

In general, there exists a predetermined circuit among semiconductor integration circuits to latch a data for a predetermined duration, which is referred to as a latch circuit. That is, if an inputted data is in a logic low level, the latch circuit maintains and outputs the inputted data of the logic low level till a new data is inputted thereto. Likewise, in case that the input data is in a logic high level, the latch circuit maintains and outputs the inputted data of the logic high level until a new data is inputted thereto.

Meanwhile, a data input/output type is mainly classified into two ways in the semiconductor integration circuit. That is, one is a type that the data is inputted/outputted in synchronization with a rising edge or a falling edge of a clock signal, and the other is a type that the data is inputted/outputted regardless of the clock signal.

Each type has its own merits and demerits in comparison with each other. However, a synchronous type, i.e., the former type of the two, in which an input/output timing of the data signal is accurately known, has been widely used for the semiconductor integration circuit requiring high-speed performance nowadays.

In a synchronous circuit, the latch circuit, which keeps and outputs the inputted data as it is after receiving the data, receives the data in synchronization with the rising edge or the falling edge of the clock signal.

In a data latch circuit that receives the data by using the clock signal, in order to stably latch the data, the data signal should be inputted before a predetermined time prior to a transition point of the clock signal and an input of the data signal should be maintained for a certain time after the transition point of the clock signal.

At this time, a time that the data signal should be inputted before the predetermined time prior to the transition point of the clock signal is referred to as a set-up time of the data signal. In addition, a time that the data input should be maintained for the certain time after the transition point of the clock signal is referred to as a hold time of the data signal.

Therefore, in order that the data latch circuit may stably latch the data in synchronization with the clock signal, the data should be inputted before the set-up time of the clock signal and also, the data input should be maintained for the hold time at least.

FIG. 1 is a circuit diagram setting forth a conventional data latch circuit.

Referring to FIG. 1, the conventional latch circuit includes an input driver 50, an input processor 30, an amplifier 20, a precharger 10 and an output latch 40. Herein, the input driver 50 receives a data signal so as to output a pair of input control signals S and SB. The input processor 30 transfers the data signal to a first and a second nodes LN1 and LN2 in response to the input control signals S and SB, respectively. The amplifier 20 amplifies and latches the data signals of the first and the second nodes LN1 and LN2 in response to the pair of the input control signals S and SB which are transferred to the input processor 30. The precharger 10 precharges the first and the second nodes LN1 and LN2 of the amplifier 20 in response to the clock signal CLK. The output latch 40 outputs the amplified and latched data signal transferred from the first and the second nodes LN1 and LN2 of the amplifier 20.

FIG. 2 is a timing diagram setting forth an operation of the conventional data latch circuit of FIG. 1, which shows problems of the conventional data latch circuit in particular. Referring to FIGS. 1 and 2, the operation of the conventional data latch circuit will be set forth more fully in detail, and further its drawbacks will be illustrated also herebelow.

As shown in FIG. 2, when the clock signal CLK is inputted as being clocking, the first and the second nodes LN1 and LN2 of the amplifier 20 are precharged to high levels while the clock signal CLK is inputted in a state of a logic low level. On the contrary, while the clock signal CLK is inputted in a state of a logic high level, the first and the second nodes LN1 and LN2 of the amplifier 20 store the data signal according to the pair of the input control signals S and SB transferred to the input processor 30.

Provided that the data of a logic high level is inputted to the input driver 50, the pair of the input control signals S and SB become logic high level and low level respectively, and then they are transferred to the input processor 30.

According to the pair of the input control signals S and SB transferred to the input processor 30, the first and the second nodes LN1 and LN2 are transited to a logic low level and a high level, respectively. Furthermore, the amplifier 20 induces each node LN1 and LN2 to be transited more rapidly.

After the first and the second nodes LN1 and LN2 are transited to the logic low level and the high level respectively, the output latch unit 40 latches the data signal of the logic high level at a latch IV4 and IV5 by using the signals of the first and the second nodes LN1 and LN2, and then outputs the latched signal LAT_OUT of a logic high level as an output signal.

Typically, the data signal LAT_IN is a signal having a low frequency and the clock signal CLK is a high frequency signal.

Meanwhile, as illustrated in FIG. 2, a clocking of the clock signal CLK still continues for one latch time that the data signal LAT_IN is latched, so that circuits in the amplifier 20 and the precharger 10 perform a charge and a discharge operation continuously.

The first node LN1 keeps the logic low level by the input control signal S of the logic high level inputted thereto, and the second node LN2 keeps the logic high level by the input control signal SB of the logic low level inputted thereto. This causes one of the first and the second nodes LN1 and LN2 of the amplifier 20 to be charged/discharged continuously while the data signal is being inputted.

Herein, if the input control signal S keeps the logic high level, a metal oxide semiconductor (MOS) transistor Q8 is turned on and the first node LN1 is continuously charged/discharged according to the clocking of the clock signal CLK.

After all, since the clock signal CLK is yet clocking during the data signal input time, the precharger 10 and the amplifier 20 continuously operate, which incurs lots of current consumption.

In FIG. 2, three closed loops of elliptical dot lines represent charge/discharge current consumption regions at the precharger 10 and the amplifier 20 during the data signal input time.

Meanwhile, this current consumption becomes more serious when a frequency of the clock signal CLK becomes higher than the data signal input time. Therefore, since the frequency of the clock signal CLK will become higher and higher for enhancing operation speed of the semiconductor integration circuit in the future, the amount of charge/discharge current will be more and more increased, which will result in increasing unnecessary current consumption while latching the data in the long run.

SUMMARY OF THE INVENTION

It is, therefore, an object of the present invention to provide a data latch circuit where an unnecessary charge/discharge current is not generated regardless of a clocking of a clock signal of which a frequency is higher than a frequency of a data signal, in latching the data signal in synchronization with the clock signal.

It is, therefore, another object of the present invention to provide a method for latching a data signal in synchronization with a clock signal capable of reducing an unnecessary charge/discharge current regardless of a clocking of a clock signal.

In accordance with an aspect of the present invention, there is provided a data latch circuit of a semiconductor device latching a data signal in synchronization with a clock signal, including: a data input controller for outputting a first data transition detection signal in response to a first timing of inputting the data signal, and outputting a second data transition detection signal in response to a second timing of outputting the data signal; and a data latch unit for starting latching the data signal in response to the first data transition detection signal and finishing latching the data signal in response to the second data transition detection signal, wherein the data latch unit deactivates the first data transition detection signal corresponding to the start of latching the data signal, and outputs a feedback signal for deactivating the second data transition detection signal corresponding to the finish of latching the data signal.

In accordance with another aspect of the present invention, there is provided a method for latching a data signal in synchronization with a clock signal in a semiconductor device, the method including: outputting an input start signal as being activated corresponding to a first timing of an inputting data signal; latching the data signal transferred by the input start signal in synchronization with the clock signal and outputting the latched data signal; deactivating the input start signal corresponding to a latch operation of the data signal; outputting an input finish signal as being activated corresponding to a first timing of an inputting data signal; resetting the latched data signal corresponding to the input finish signal in synchronization with the clock signal; and deactivating the input finish signal corresponding to a reset operation of the data signal.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A data latch circuit of a semiconductor device and a method for latching a data circuit in accordance with exemplary embodiments of the present invention will be described in detail with reference to the accompanying drawings.

Figure 1:
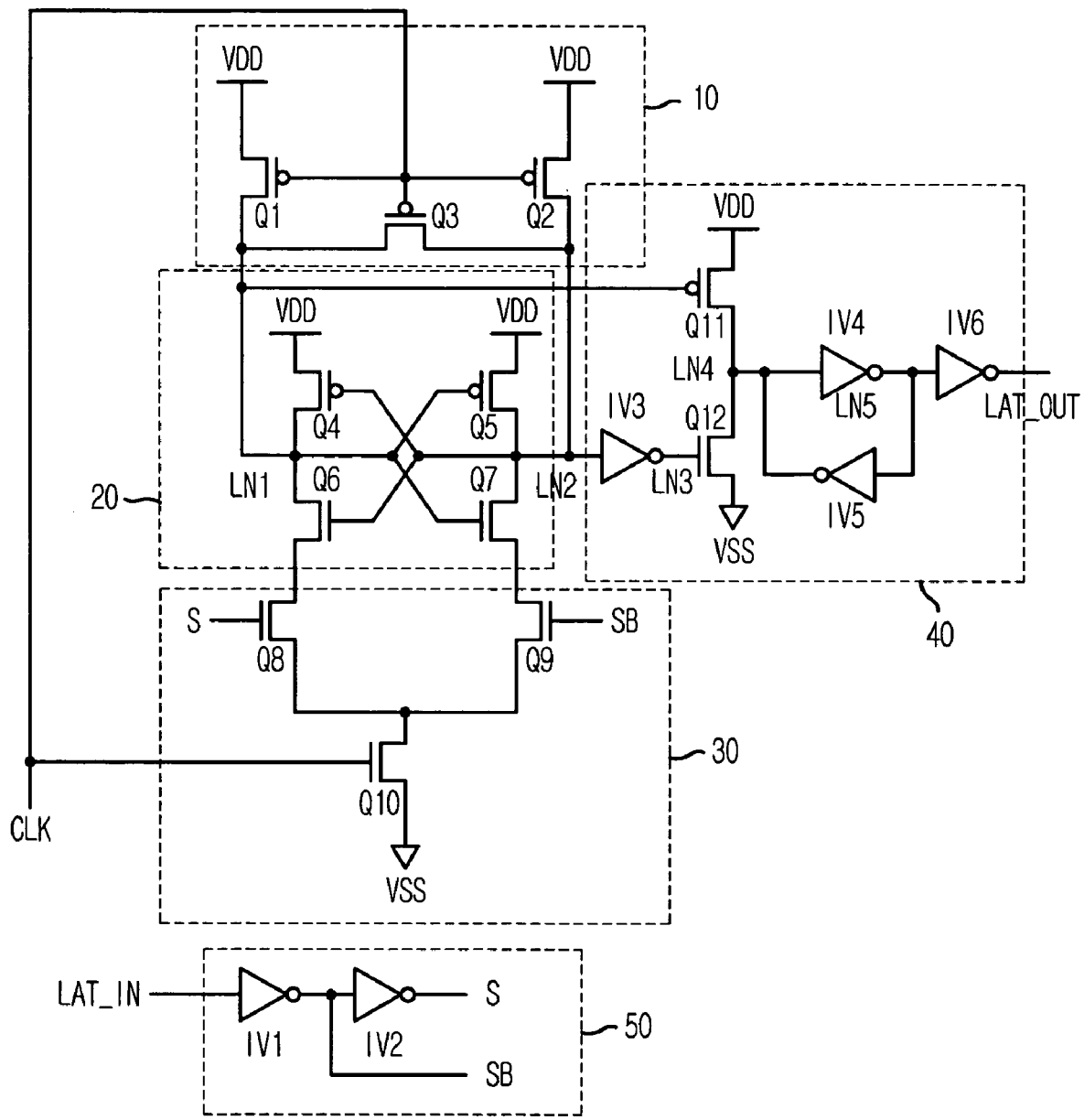
FIG. 1 is a circuit diagram setting forth a conventional data latch circuit.
Figure 2:
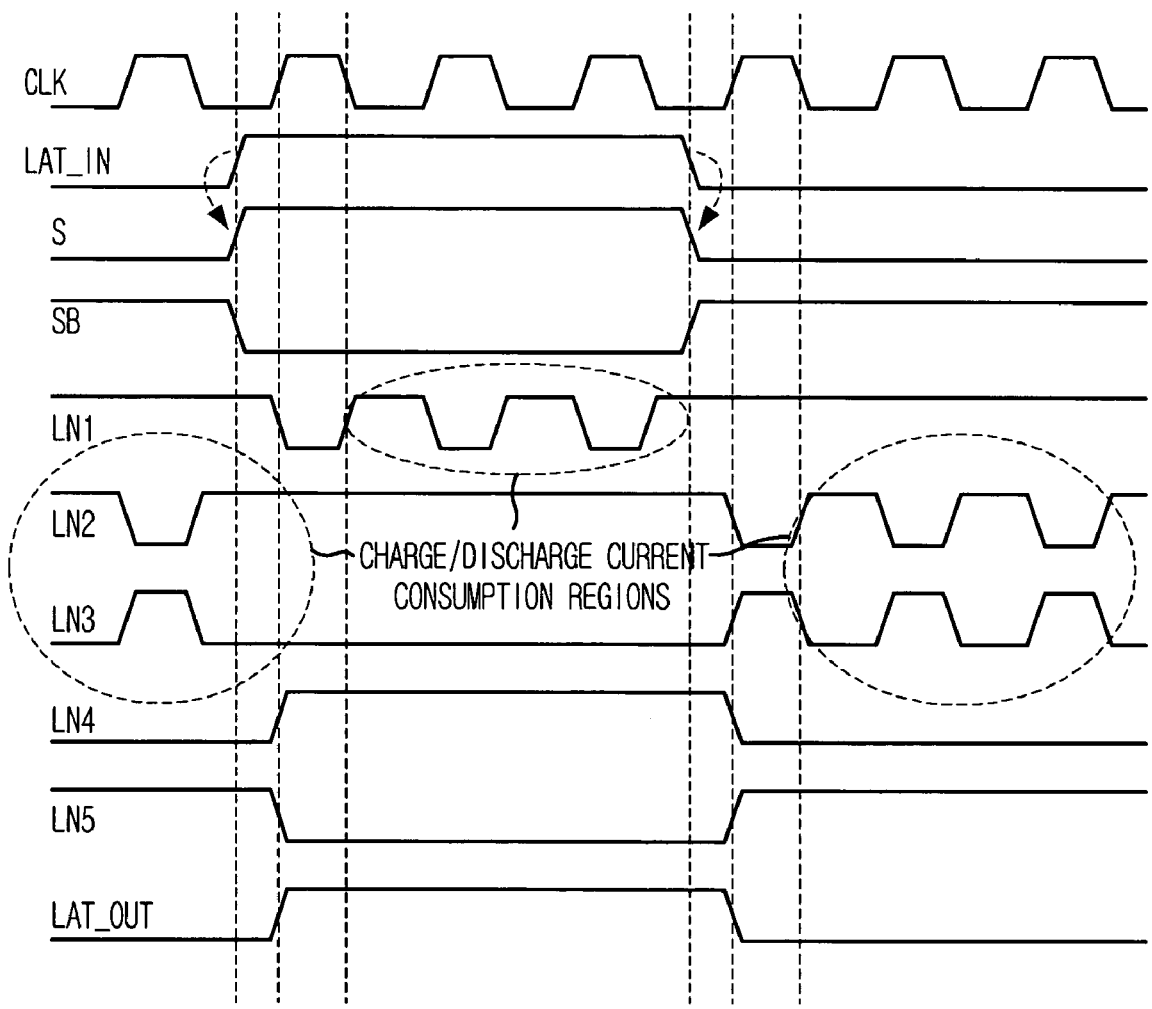
FIG. 2 is a timing diagram setting forth an operation of the conventional data latch circuit of FIG. 1.
Figure 3:
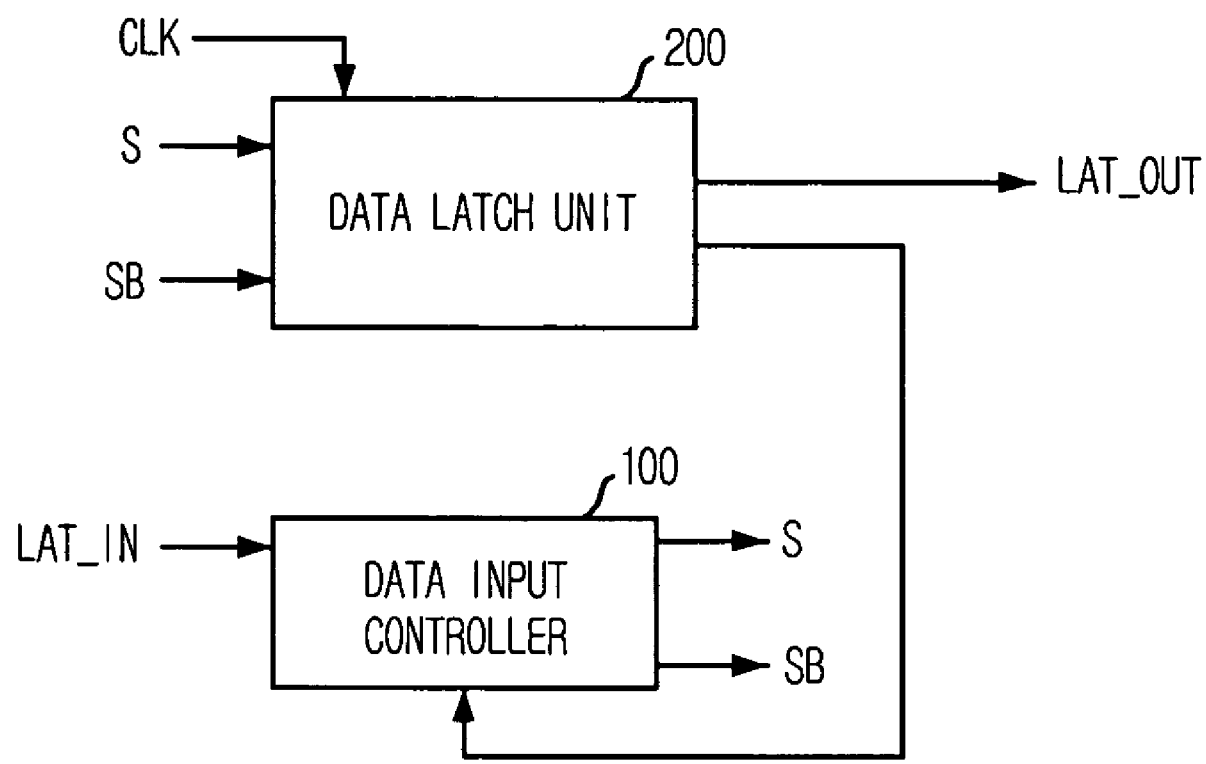
FIG. 3 is a block diagram setting forth a data latch circuit of a semiconductor device in accordance with a specific embodiment of the present invention.

FIG. 3 is a block diagram setting forth a data latch circuit of a semiconductor device in accordance with a specific embodiment of the present invention.

Referring to FIG. 3, the data latch circuit of the present invention includes a data input controller 100 and a data latch unit 200. Herein, the data input controller 100 outputs a first data transition detection signal S in response to a first transition point of a data signal LAT_IN and outputs a second data transition detection signal SB in response to a second transition point of the data signal LAT_IN, in order to latch the data signal LAT_IN in synchronization with a clock signal CLK. The data latch unit 200 starts a latch operation for the data signal LAT_IN in response to the first data transition detection signal S and finishes the latch operation for the data signal LAT_IN in response to the second data transition detection signal SB.

The data latch unit 200 deactivates the first data transition detection signal S corresponding to the start of latching the data signal LAT_IN, and activates the second data transition detection signal SB corresponding to the finish of latching the data signal LAT_IN.

Herein, the first and the second data transition detection signals are not fixed to the above like S and SB so that the first one may be SB and the second one may be S if necessary. This is determined mainly by a logic level of the inputted data signal.

Figure 4:
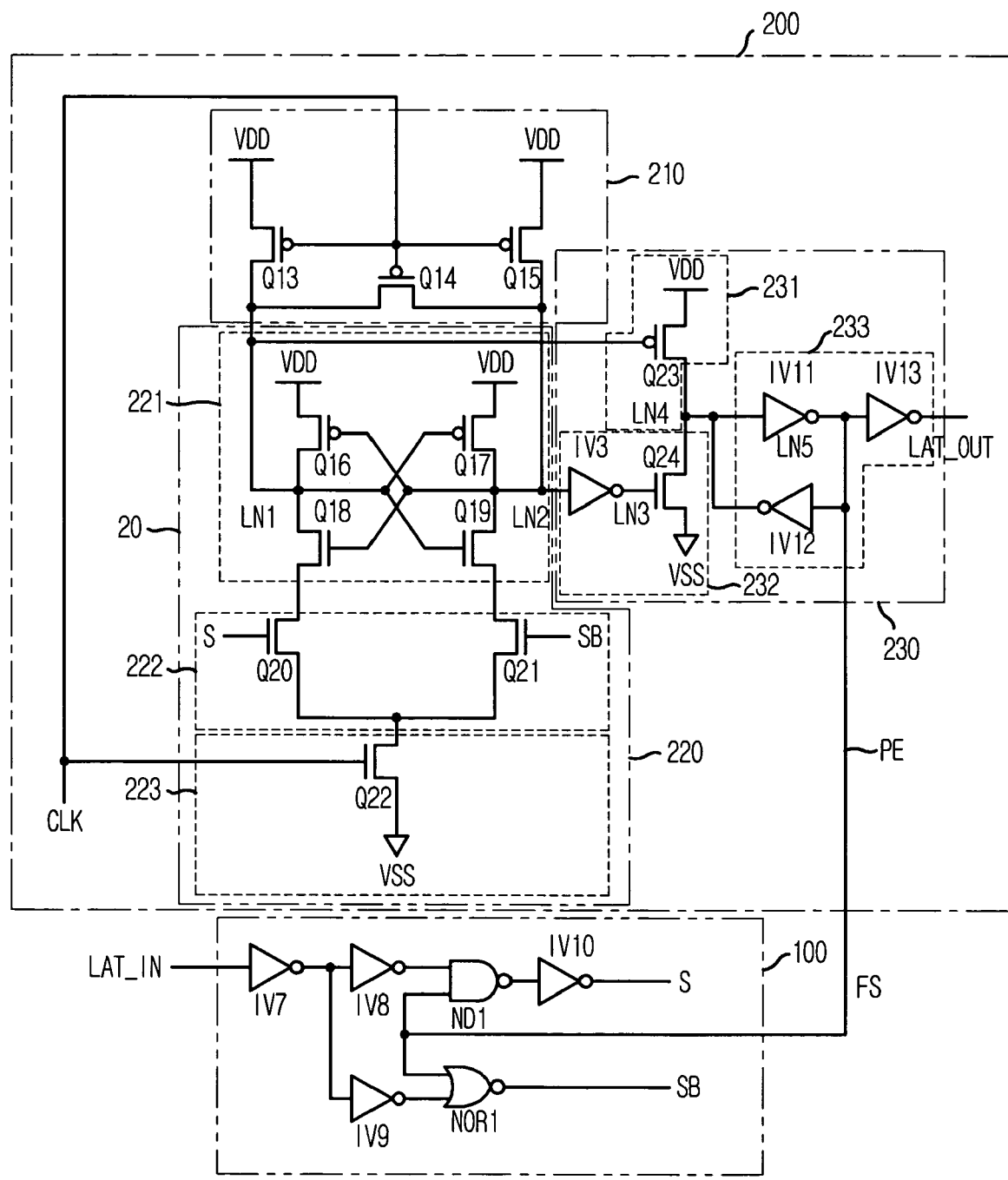
FIG. 4 is a circuit diagram setting forth the data latch unit and the data input controller of FIG. 3.

FIG. 4 is a circuit diagram illustrating the data latch unit and the data input controller of FIG. 3.

Referring to FIG. 4, the data input controller 100 includes a first AND logic circuit for performing a logic AND operation to the data signal LAT_IN and a feedback signal FS so as to output the first data transition detection signal S, and a second AND logic circuit for performing a logic AND operation to the data signal LAT_IN and a feedback signal FS so as to output the second data transition detection signal SB.

The first AND logic circuit is provided with an NAND gate ND1 receiving the data signal buffered through inverters IV7 and IV8 connected to each other in series, and an inverter IV10 for inverting the output of the NAND gate ND1 so as to output the first data transition detection signal S.

The second AND logic circuit is provided with a NOR gate NOR1 for receiving the data signal LAT_IN and the feedback signal FS to output the second data transition detection signal SB.

The data latch unit 200 includes a precharger 210, a data-storing unit 220 and a latch output unit 230. Herein, the precharger 210 precharges the first and the second nodes LN1 and LN2 corresponding to the clocking of the clock signal CLK. The data-storing unit 220 stores the data signal by discharging the first node ND1 or the second node ND2 in response to the first data transition detection signal S, and resets the stored data signal LAT_IN by charging the discharged node in response to the second data transition detection signal. The latch output unit 230 latches and outputs the data signal LAT_IN corresponding to charging/discharging states of the first and the second nodes LN1 and LN2.

The precharger 210 is provided with a first MOS transistor Q13 for providing a power voltage VDD to the first node LN1 in response to the clock signal CLK, a second MOS transistor Q14 for providing the power voltage VDD to the second node LN2 in response to the clock signal CLK, and a third MOS transistor Q15 for rendering electric potentials of the first and the second nodes LN1 and LN2 be equal to each other.

The data-storing unit 220 is provided with an amplifier 221, a charge/discharge controller 222 and a current transfer unit 223. Herein, the amplifier 221 detects the first and the second nodes LN1 and LN2 as being cross-coupled to each other and amplifies them. The charge/discharge controller 222 discharges the first node LN1 and charges the second node LN2 in response to the first data transition detection signal S. Vice versa, the charge/discharge controller 222 discharges the second node LN2 and charges the first node LN1 in response to the second data transition detection signal SB. The current transfer unit 223 plays a role in sinking a charge/discharge current by means of the charge/discharge controller 221 in response to the clocking of the clock signal CLK.

The amplifier 221 is configured with a fifth MOS transistor Q17 of which a gate is connected to the first node LN1 and one side is connected to the power voltage VDD, a seventh MOS transistor of which a gate is connected to the first node LN1 and one side is connected to the other side of a fourth MOS transistor Q16, the fourth MOS transistor Q16 of which a gate is connected to the second node LN2 and one side is connected to the power voltage VDD, and a sixth MOS transistor Q18 of which a gate is connected to the second node LN2 and one side is connected to the other side of the fourth MOS transistor Q16.

The charge/discharge controller 222 is provided an eighth MOS transistor Q20 of which one side is connected to the other side of the sixth MOS transistor Q18 in order to discharge the first node LN1 in response to the first data transition detection signal S, and a ninth MOS transistor Q21 of which one side is connected to the other side of the seventh MOS transistor Q17 in order to discharge the second node LN2 in response to the second data transition detection signal SB.

The current transfer unit 223 is provided with a tenth MOS transistor Q22 receiving the clock signal CLK through a gate thereof, connected between the other sides of the tenth MOS transistor Q22 and the ground voltage VSS.

The latch output unit 230 is provided with a pull-up unit 231 for pulling up a third node LN4 in response to a logic level of the first node LN1, a pull-down unit 232 for pulling down the third node LN4 in response to a logic level of the second node LN2, and a data signal latch 233. Herein, the data signal latch 233 latches the signal transferred to the third node LN4 and then outputs the latched signal. In addition, the data signal latch 233 outputs the feedback signal FS to the input controller 100, wherein the feedback signal FS plays a role in deactivating the first and the second data transition detection signals S and SB by using the latched signal.

The pull-up unit 231 is configured with an eleventh MOS transistor Q23 of which a gate is connected to the first node LN1 and one side and the other side are connected to the power supply terminal VDD and the third node LN4, respectively.

The pull-down unit 232 is configured with an inverter IV13 for inverting the signal applied to the second node LN2, a twelfth MOS transistor Q24 receiving the output signal of the inverter IV13 through a gate thereof, of which one side and the other side are connected to the ground voltage terminal VSS and the third node LN4, respectively.

The data signal latch 233 is configured with inverters IV11 and IV12 of which each input terminal of one inverter is connected to an output terminal of the other one for latching the signal applied to the third node LN4, and an inverter 15 for inverting the output of the inverter IV11.

Figure 5:
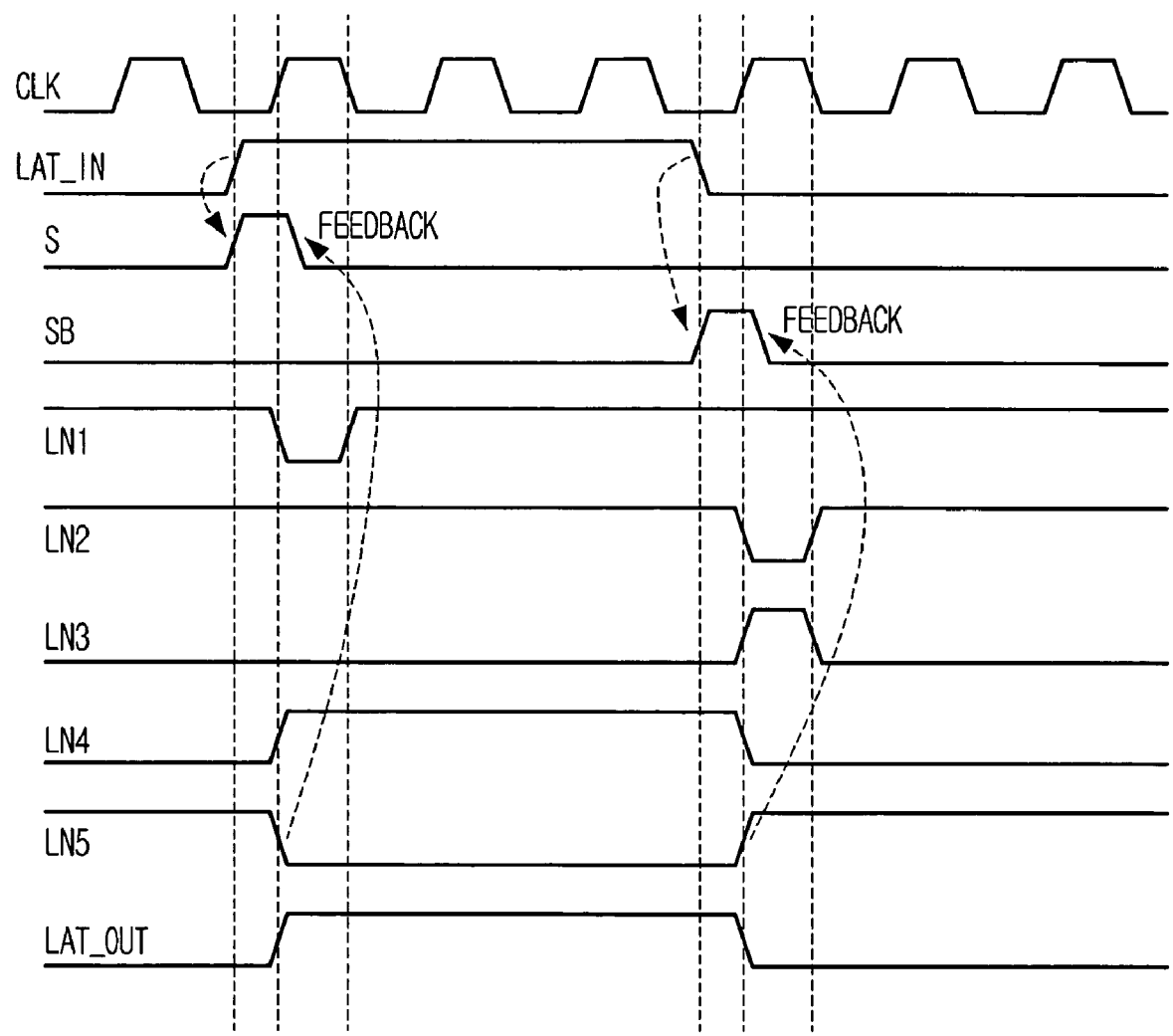
FIG. 5 is a timing diagram setting forth an operation of the data latch circuit of FIG. 3.

FIG. 5 is a timing diagram setting forth an operation of the data latch circuit of FIG. 3. Referring to FIGS. 3 to 5, the operation of the inventive data latch circuit will be set forth hereinafter.

To begin with, when the data signal LAT_IN is inputted and transited to a first logic level, the data input controller 100 detects it so as to output the first data transition detection signal S of logic high level.

In detail, the NAND gate ND1 performs a logic NAND operation to the feedback signal FS fed back as being in logic high level and the data signal LAT_IN transited to logic high level so as to transit the output signal to become logic low level. The inverter IV10 outputs the first data transition detection signal S activated to logic high level into the data latch unit 200.

Meanwhile, the precharger 210 of the data latch unit 200 is enabled and disabled repeatedly in response to the clock signal CLK so that the data latch unit 200 becomes enabled to precharge the first and the second nodes LN1 and LN2 while the clock signal CLK is inputted as being in logic low level.

The precharger 210 is disabled, while the clock signal CLK is inputted in a state of logic high level, and the data-storing unit 220 is enabled so that one of the first and the second nodes LN1 and LN2, which is precharged to logic high level, becomes discharged in response to the input signal of two input signals S and SB which are activated in logic high level.

Herein, since the first data transition detection signal is inputted as being in logic high level, the first node LN1 is discharged and the second node LN2 keeps logic high level.

Therefore, the pull-up unit 231 becomes enabled and the third node LN4 becomes logic high level so that the latched data signal of logic high level is outputted as the latched output signal LAT_OUT.

In addition, the output signal of the inverter IV11, i.e., the feedback signal FS, is outputted as being in logic low level so as to deactivate the first data transition detection signal S to be in logic low level outputted through the inverter IV12. Therefore, the first data transition detection signal S becomes a pulse typed signal maintaining logic high level for only a predetermined period in virtue of the feedback signal FS fed back from the output latch unit 230.

In case that the first data transition detection signal S of logic low level is inputted, the eighth MOS transistor Q20 is turned off and the first node LN1 becomes in a floating state.

Subsequently, when the data signal LAT_IN is transited from high level to low level, i.e., when the data input is finished, the data signal LAT_IN of logic low level and the feedback signal FS of logic low level are combined together so that the output of the NOR gate NOR1 becomes the second data transition detection signal SB of logic high level, which is outputted to the data latch unit 220.

At the data latch unit 220, the second node LN2, which has been charged to be in logic high level, is discharged in response to the second data transition detection signal SB of logic high level.

If the second node LN2 becomes logic low level, the output of the inverter IV13 becomes logic high level and the twelfth MOS transistor Q24 for pull-down is turned on so that the third node LN4 is transited to logic low level.

At this time, the first node LN1 is charged to logic high level and the eleventh MOS transistor Q23 for pull-up is turned off.

That is, a signal of logic low level is latched at the third node LN4 of the output latch unit 230, which causes the output signal LAT_IN to be transited to logic low level. This means that the latched data signal of logic high level is not outputted any more and the latch operation is finished.

Since the feedback signal FS of logic high level is outputted through an inverter IV14, the output of the NOR gate NOR1, i.e., the second data transition detection signal SB is disabled to be in logic low level.

Provided that the second data transition detection signal SB is outputted as being in logic low level, the ninth MOS transistor Q21 of the data latch unit 220 is turned off and the second node LN2 becomes a floating state.

As described above, while the data signal of logic high level is inputted and latched at the data latch circuit of the present invention, the first and the second data transition detection signals S and SB are outputted as pulse signals having logic high levels in response to two transition points of the data signal, and the data of logic high level is latched and outputted only between the first and the second transition detection signals S and SBG.

At this time, since the amplifier 221 for detecting and amplifying the data is operated while the first and the second data transition detection signals S and SB of pulse signals are inputted thereto, there is no operational current consumption during the data signal input time although the clock signal CLK is continuously inputted to the data latch unit 220.

Therefore, in comparison with the conventional data latch circuit in which the operational current is consumed on and on as the clocking of the clock signal, the operational current is consumed only at the transition point of the data signal in the inventive latch circuit so that it is possible to reduce current consumption while the data signal is latched and outputted in synchronization with the clock signal. In particular, as the period that the data signal is inputted is longer and longer than the clocking of the clock signal, more and more operational current is saved.

In addition, though the data signal is inputted at every clocking time of the clock signal, the data latch circuit of the present invention can reduce the amount of the operational current in case that the same data are inputted successively.

A process for detecting and amplifying the input data is required for the conventional data latch circuit in order to latch the data at every clocking of the clock signal so that the operational current is generated on and on at every period of the clock signal though the same data is inputted successively. However, in accordance with the present invention, the operational current is generated only at the point that the data input is finished, i.e., the first transition point.

Here, the reason that the signal denotation of S becomes the first data transition detection signal and the signal denotation of SB becomes the second data transition detection signal is that the input data signal is in logic high level. If the data signal is in logic low level, the definition of the signal is reversed.

For reference, since the data latch circuit detects the transition of the data signal and latches that data at the data input controller, the present invention is effectively applied to the case that the data signal keeps its input state besides the set-up time or the hold time.

In accordance with the present invention, in latching the data signal in synchronization with the clock signal, the operational current is consumed only for the time that the data signal is transited so that it is possible to stably latch the data signal with a minimum amount of current.

In particular, during the time period that the same data is successively inputted in a predetermined data pattern in which the data is successively inputted, since the data latch circuit is operated only between the transition time for inputting the first data signal and the transition time for finishing the last data input, it is possible to remarkably reduce the operational current in comparison with the conventional data latch circuit.

The present application contains subject matter related to the Korean patent application No. KR 2005-0027385, filed in the Korean Patent Office on Mar. 31, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A data latch circuit of a semiconductor device latching a data signal in synchronization with a clock signal, comprising:

a data input controller for outputting a first data transition detection signal in response to a first transition point of the data signal, and outputting a second data transition detection signal in response to a second transition point of outputting the data signal; and a data latch unit for starting latching the data signal in response to the first data transition detection signal and finishing latching the data signal in response to the second data transition detection signal, wherein the data latch unit deactivates the first data transition detection signal corresponding to the start of latching the data signal, and outputs a feedback signal for deactivating the second data transition detection signal corresponding to the finish of latching the data signal.

2. The data latch circuit of claim 1, wherein the data input controller includes:

a first AND means for performing a logic AND operation to the data signal and the feedback signal to output the first data transition detection signal; and a second AND means for performing a logic AND operation to the data signal and the feedback signal to output the second data transition detection signal.

3. The data latch circuit of claim 2, wherein the first AND means includes:

a NAND gate receiving the data signal and the feedback signal; and an inverter for inverting the output of the NAND gate to output the first data transition detection signal.

4. The data latch circuit of claim 3, wherein the second AND means includes a NOR gate for receiving the data signal and the feedback signal to output the second data transition detection signal.

5. The data latch circuit of claim 1, wherein the data latch unit includes:

a precharger for precharging a first and a second nodes corresponding to a clocking of the clock signal;

a data-storing unit for storing the data signal by discharging the first node or the second node in response to the first data transition detection signal, and resetting the stored data signal by charging the discharged node in response to the second data transition detection signal; and a latch output unit for latching and outputting the data signal corresponding to a charge/discharge state of the first and the second nodes.

6. The data latch circuit of claim 5, wherein the data-storing unit includes:

an amplifier for detecting the first and the second nodes as being cross-coupled and amplifying the first and the second nodes;

a charge/discharge controller for discharging the first node and charging the second node in response to the first data transition detection signal, and discharging the second node and charging the first node in response to the second data transition detection signal; and a current transfer unit for sinking a current charged or discharged by the charge/discharge controller in response to the clocking of the clock signal.

7. The data latch circuit of claim 5, wherein the latch output unit includes:

a pull-up unit for pulling up a third node in response to a state of the first node;

a pull-down node for pulling down the third node in response to a state of the second node; and a data signal latch for latching and outputting a signal transferred to the third node, and outputting the feedback signal to the data input controller for deactivating the first or the second data transition detection signal by using the latched signal.

8. The data latch circuit of claim 5, wherein the precharger includes:

a first MOS transistor for providing a power voltage to the first node in response to the clock signal;

a second MOS transistor for providing the power voltage to the second node in response to the clock signal; and a third MOS transistor for rendering each electric potential of the first and the second nodes be equal in response to the clock signal.

9. The data latch circuit of claim 6, wherein the amplifier includes:

a first MOS transistor of which a gate is connected to the first node and one side is connected to the power voltage;

a second MOS transistor of which a gate is connected to the first node and one side is connected to the other side of the first MOS transistor;

a third MOS transistor of which a gate is connected to the second node and one side is connected to the power voltage; and a fourth MOS transistor of which a gate is connected to the second node and one side is connected to the other side of the third MOS transistor.

10. The data latch circuit of claim 9, wherein the charge/discharge controller includes:

a fifth MOS transistor of which one side is connected to the other side of the fourth MOS transistor for discharging the first node in response to the first data transition detection signal; and a sixth MOS transistor of which one side is connected to the other side of the second MOS transistor for discharging the second node in response to the second data transition detection signal.

11. The data latch circuit of claim 10, wherein the current transfer unit includes a seventh MOS transistor connected between the other sides of the fifth and the sixth MOS transistors and a ground voltage, receiving the clock signal through a gate thereof.

12. The data latch circuit of claim 7, wherein the pull-up unit includes a first MOS transistor of which gate is connected to the first node and one side and the other side are connected to the power voltage and the ground voltage respectively.

13. The data latch circuit of claim 12, wherein the pull-down unit includes:

a first inverter for inverting a signal applied to the second node; and a second MOS transistor receiving the output signal of the first inverter, of which one side and the other side are connected to the ground voltage and the third node respectively.

14. The data latch circuit of claim 13, wherein the data signal latch includes:

a second and a third inverters cross-coupled for latching a signal applied to the third node; and a fourth inverter for inverting the output of the third inverter to output a latched data, wherein the data signal latch outputs the output of the second inverter as the feedback signal.

15. A method for latching a data signal in synchronization with a clock signal in a semiconductor device, the method comprising:

outputting an input start signal as being activated corresponding to a first transition point of the data signal;

latching the data signal transferred by the input start signal in synchronization with the clock signal and outputting the latched data signal;

deactivating the input start signal corresponding to a latch operation of the data signal;

outputting an input finish signal as being activated corresponding to a second transition of the data signal;

resetting the latched data signal corresponding to the input finish signal in synchronization with the clock signal; and deactivating the input finish signal corresponding to a reset operation of the data signal.

16. The method of claim 15, wherein the latching of the data signal includes:

detecting the data signal transferred by the input start signal;

amplifying the detected data signal;

latching the amplified data signal; and outputting the latched data as an output data.

* * * * *